United States Patent
Jensen

(10) Patent No.: US 7,023,028 B2
(45) Date of Patent: Apr. 4, 2006

(54) PROTECTION STRUCTURE FOR PROTECTION FROM ELECTROSTATIC DISCHARGE AND INTEGRATED CIRCUIT

(75) Inventor: Nils Jensen, München (DE)

(73) Assignee: Infineon Technologies AG, Munich (DE)

( * ) Notice: Subject to any disclaimer, the term of this patent is extended or adjusted under 35 U.S.C. 154(b) by 124 days.

(21) Appl. No.: 10/834,759

(22) Filed: Apr. 27, 2004

(65) Prior Publication Data

US 2004/0218335 A1    Nov. 4, 2004

(30) Foreign Application Priority Data

Apr. 30, 2003   (DE) .............................. 103 19 539

(51) Int. Cl.
*H01L 29/74*    (2006.01)
*H01L 31/111*   (2006.01)

(52) U.S. Cl. .................. 257/111; 257/173; 257/146

(58) Field of Classification Search .............. None
See application file for complete search history.

(56) References Cited

U.S. PATENT DOCUMENTS 5,747,834 A * 5/1998 Chen et al. ............... 257/111

6,194,764 B1   2/2001 Gossner et al.
6,320,232 B1  11/2001 Gossner et al.
6,441,437 B1   8/2002 Gossner

FOREIGN PATENT DOCUMENTS

DE   197 43 240 C1   4/1999
EP   0 905 782 A1    3/1999
EP   1 019 964 B1    7/2000

* cited by examiner

*Primary Examiner*—David Nelms
*Assistant Examiner*—Long Tran
(74) *Attorney, Agent, or Firm*—Laurence A. Greenberg; Werner H. Stemer; Ralph E. Locher

(57) ABSTRACT

An ESD protection structure for protecting an integrated circuit from electrostatic discharge, having a bipolar protection element, whose emitter is formed by an emitter zone of the first conduction type, whose collector is formed by a buried layer of the first conduction type, and whose base is formed by a base zone of the second conduction type disposed in-between. The base zone is spaced apart from the buried layer by an intermediate layer. Highly and lightly doped regions alternatively are provided in a section of the buried layer. The highly doped regions are spaced apart from one another by the lightly doped regions. A region with a reduced breakdown voltage of the protection element is disposed in a part of the protection element spaced apart from the section of the buried layer. Also provided is an integrated circuit having such an ESD protection structure.

26 Claims, 4 Drawing Sheets

PROTECTION STRUCTURE FOR PROTECTION FROM ELECTROSTATIC DISCHARGE AND INTEGRATED CIRCUIT

BACKGROUND OF THE INVENTION

FIELD OF THE INVENTION

The invention relates to an electrostatic discharge (ESD) protection structure for protecting an integrated circuit from electrostatic discharge of having a bipolar protection element and to an integrated circuit having an ESD protection structure.

Circuits integrated in a chip typically contain protection structures for protecting the inputs or outputs (I/O ports) against electrostatic overvoltages and electrostatic discharges caused thereby. These so-called ESD protection elements are connected between a terminal pad of an integrated circuit and the input or output terminal to be protected and ensure that when a parasitic, i.e., undesirably high, voltage is coupled in, the ESD protection element is activated and the parasitic overvoltage pulse is, thus, conducted away to a supply voltage interconnect.

ESD protection elements may be constructed as diodes, bipolar transistors, thyristors, etc., which are disposed between the terminals of the circuit to be protected and a terminal pad.

In the case of ESD protection elements having a pronounced snapback behavior (see FIG. 1), such as thyristor and bipolar transistors, for example, an undesirable activation of one or a plurality of the parasitic bipolar transistors may occur in the event of very fast switch-on operations or interference pulses, even though the breakdown voltage determined by characteristic curve measurements in the low-current range lies outside the specified signal voltage range. This is also referred to as a so-called transient latch-up effect, which generally leads to the destruction of the ESD protection element.

The transient latch-up occurs particularly in smart power applications. For terminals that may be exposed to very fast voltage edges without the external circuitry providing sufficient current limiting, particular care has to be taken, when using such ESD protection elements, to ensure that the holding voltage lies above the specified signal voltage in a defined manner, to, thus, avoid the transient activation (latch-up effect) of the ESD protection element.

If the holding voltage $U_H$ lies below the operating voltage of the terminal pad to be protected, then the ESD protection structure remains at the common operating point of the integrated circuit and the ESD protection structure after a coupled-in parasitic pulse. This latch-up effect often leads to the destruction of the ESD protection structure and, thus, also of the integrated circuit that is to be protected by the ESD protection structure.

Such a problem can be avoided by selecting the holding voltage $U_H$ above the maximum operating voltage in a defined manner. The holding voltage of active npn bipolar transistors is described by the relationship $$U_H = U_{CB} * \beta^{-1/4},$$

where $\beta$ designates the collector-base current gain and $U_{CB}$ designates the collector-base breakdown voltage.

To increase the holding voltage $U_H$ of the bipolar transistors, it is, thus, necessary either to increase the collector-based breakdown voltage $U_{CB}$ or to reduce the current gain $\beta$. Reducing the current gain is not advantageous, however, because this would also impair the protective effect. Consequently, the collector-base breakdown voltage has to be increased in order to increase the holding voltage of the protection element. As an important boundary condition in the development of an ESD protection structure, however, the breakdown voltages of the remaining components of the integrated circuit are not permitted to be altered. Increasing the epitaxial layer thickness and reducing the doping in the epitaxial layer are, thus, precluded.

To increase the holding voltage, by way of example, two ESD protection structures configured as npn bipolar transistors may be disposed in series with one another in order, thereby, to double the holding voltage. However, connecting ESD individual structures in series is extremely area-intensive. Moreover, as a result of such a configuration, a defined setting of the holding voltage is not possible or is possible only to an unsatisfactory extent.

A further possibility is described in the European Patent EP 1 019 964 B1, corresponding to U.S. Pat. No. 6,441,437 to Gossner, wherein, for setting the breakdown voltage and, thus, also the holding voltage, the collector formed as a buried layer is equipped with integrated resistance regions which are laterally spaced apart from one another. In Gossner, the breakdown voltage and, at the same time, also the holding voltage can be set by the laterally spaced-apart resistance regions and by a suitable selection of the base width of the protection transistor.

A further possibility is described in the European Patent Application EP 905 782 A1, corresponding to U.S. Pat. No. 6,320,232 to Gossner et al., in which the base zone and collector zone, which is formed as a buried layer, are disposed laterally offset in the projection of the plan view. This lateral structuring increases the effective distance between base and collector.

What is problematic about the solutions described in Gossner et al. and Gossner is that, there, the setting of the holding voltage is always also accompanied by the setting of the breakdown voltage. Furthermore, the dimensions, doping concentrations, and profiles, in particular, those in the buried layer, cannot be set very exactly, which also means that the breakdown voltage and, thus, the holding voltage cannot be determined exactly in advance. It would be desirable, however, in particular, for determining the breakdown voltage, if the latter can be determined very exactly to optimally adapt the ESD protection structure to the integrated circuit to be protected. This will become more and more important particularly in future integrated circuits in which the circuits will be configured for an ever smaller supply voltage.

SUMMARY OF THE INVENTION

It is accordingly an object of the invention to provide a protection structure for protection from electrostatic discharge and integrated circuit that overcome the hereinafore-mentioned disadvantages of the heretofore-known devices of this general type and that, in the ESD protection structure, the breakdown voltage can be set for the prescribed ESD-specific boundary conditions as far as possible without impairing the holding voltage and the ESD strength.

With the foregoing and other objects in view, there is provided, in accordance with the invention, an ESD protection structure for protecting an integrated circuit from electrostatic discharge, including a bipolar protection element having an emitter zone of a first conduction type forming an emitter, a buried layer of the first conduction type forming a collector, a base zone of a second conduction type disposed between the emitter zone and the buried layer and forming a base, an intermediate layer disposed between the base zone and the buried layer and spacing the base zone apart from the buried layer, the buried layer having at least one section in which are disposed highly doped and lightly doped regions, the highly doped regions being spaced apart from one another by the lightly doped regions, and a breakdown region having a reduced breakdown voltage of the protection element, the breakdown region being disposed in a part of the protection element spaced apart from the section of the buried layer.

According to the invention, an ESD protection structure for protecting an integrated circuit from electrostatic discharge, includes a bipolar protection element, whose emitter is formed by an emitter zone of the first conduction type, whose collector is formed by a buried layer of the first conduction type and whose base is formed by a base zone of the second conduction type disposed in-between. The base zone is spaced apart from the buried layer by an intermediate layer. Highly doped and lightly doped regions alternatively are provided in a section of the buried layer and the highly doped regions are spaced apart from one another by the lightly doped regions, in which case a region with a reduced breakdown voltage of the protection element is provided, which is disposed in a part of the protection element that is spaced apart from the section of the buried layer.

In accordance with another feature of the invention, partial regions of the base zone and of the buried layer form the breakdown region and the partial regions of the base zone and of the buried layer have a smaller distance from one another in comparison with remaining regions of the base zone and of the buried layer.

In accordance with a further feature of the invention, the base zone and/or the buried layer in the breakdown region projects into the intermediate layer in the manner of a plug and/or a trench.

In accordance with an added feature of the invention, a portion of the base zone and/or the buried layer in the breakdown region is a plug or a trench projecting into the intermediate layer.

In accordance with an additional feature of the invention, the buried layer and/or the breakdown region are disposed at least partially around the emitter zone, in particular, in an annular shape.

In accordance with yet another feature of the invention, the buried layer and/or the breakdown region has a cross-sectional shape in the form of a strip, a rectangular, round, and/or an annulus.

In accordance with yet a further feature of the invention, the emitter zone and the buried layer are disposed laterally offset with respect to one another.

In accordance with yet an added feature of the invention, when the emitter zones and/or the buried layer is at least partly angular, the buried layer is offset laterally both in a first direction, prescribed by an edge of at least one of the emitter zone and the buried layer, and in a second direction perpendicular thereto.

In accordance with yet an additional feature of the invention, the intermediate layer is of the first conduction type and is a constituent part of an epitaxial layer.

In accordance with again another feature of the invention, there is provided at least one highly doped terminal zone of the first conduction type and the terminal zone is connected to the buried layer and to a busbar for conducting away an electrical pulse.

In accordance with again a further feature of the invention, a terminal pad and an anode zone of the second conduction type disposed between the buried layer and the terminal pad.

In accordance with again an added feature of the invention, a terminal pad to be protected, at least one busbar with a supply potential, the bipolar protection element having controlled load path disposed between the terminal pad and the busbar for conducting away a coupled-in electrical pulse.

In accordance with again an additional feature of the invention, the integrated circuit has a terminal pad to be protected and at least one busbar with a supply potential and the bipolar protection element has a controlled load path to be disposed between the terminal pad and the busbar for conducting away a coupled-in electrical pulse.

In accordance with still another feature of the invention, the integrated circuit has at least one busbar with a supply potential, and the bipolar protection element has a terminal pad to be protected and a controlled load path disposed between the terminal pad and the busbar for conducting away a coupled-in electrical pulse.

In accordance with still a further feature of the invention, there is provided at least one drive device connected to the base and actively driving the base. Preferably, the drive device is an integrated diode and/or an integrated resistor.

With the objects of the invention in view, there is also provided a ESD protection structure, including a bipolar protection element to be connected to an integrated circuit for protecting the integrated circuit from electrostatic discharge, the bipolar protection element having an emitter zone of a first conduction type, a buried layer of the first conduction type, a base zone of a second conduction type disposed between the emitter zone and the buried layer, an intermediate layer spacing the base zone apart from the buried layer, the buried layer having at least one section in which are disposed highly doped and lightly doped regions, the highly doped regions being spaced apart from one another by the lightly doped regions, and a breakdown region having a reduced breakdown voltage and being disposed in a part of the protection element spaced apart from the section of the buried layer.

According to the invention, an integrated circuit, which is disposed in at least one semiconductor body, has at least one terminal pad, which is connected to the integrated circuit through an electrical connecting line having at least one busbar, which, during operation, has at least one supply potential for the integrated circuit, having at least one ESD protection structure according to the protection structure of the invention, the protection element of which being disposed between the terminal pad and the integrated circuit and being connected to at least one of the busbars.

With the objects of the invention in view, there is also provided at least one semiconductor body, including an integrated circuit, at least one terminal pad, an electrical connecting line electrically connecting the terminal pad to the integrated circuit, busbars, at least one of the busbars being connected to the integrated circuit and, at least during operation of the busbar, supplying at least one supply potential to the integrated circuit, and at least one ESD protection structure for protecting the integrated circuit from electrostatic discharge, the protection structure having a bipolar protection element disposed between the terminal pad and the integrated circuit and being connected to at least one of the busbars, the bipolar protection element having an emitter zone of a first conduction type, a buried layer of the first conduction type, a base zone of a second conduction type disposed between the emitter zone and the buried layer, an intermediate layer spacing the base zone apart from the buried layer, the buried layer having at least one section in which are disposed highly doped and lightly doped regions, the highly doped regions being spaced apart from one another by the lightly doped regions, and a breakdown region having a reduced breakdown voltage and being disposed in a part of the protection element spaced apart from the section of the buried layer, and at least one of the base zone and the buried layer being electrically connected to the connecting line.

In accordance with a concomitant feature of the invention, the integrated circuit is a semiconductor memory, a logic circuit, a smart power semiconductor component, and/or a program-controlled unit.

The idea underlying the present invention is substantially based on construction measures for the defined and independent setting of the holding voltage and breakdown voltage.

A particular advantage of the ESD protection structure according to the invention is that the setting of the holding voltage and the breakdown voltage of the bipolar ESD protection element is separated, in this case, in a very simple and effective manner. In particular, the holding voltage can be set in a defined manner by virtue of the particular structuring of the buried layer and also the lateral configuration and the dimensioning thereof. Independently thereof, in a region of the ESD protection structure that is locally separate therefrom, the breakdown voltage can be set in a defined manner by a blocking pn junction. The blocking pn junction is configured according to the invention such that the ESD protection structure breaks down first there, as a result of which the breakdown voltage is set in a defined manner.

Other features that are considered as characteristic for the invention are set forth in the appended claims.

Although the invention is illustrated and described herein as embodied in a protection structure for protection from electrostatic discharge and integrated circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
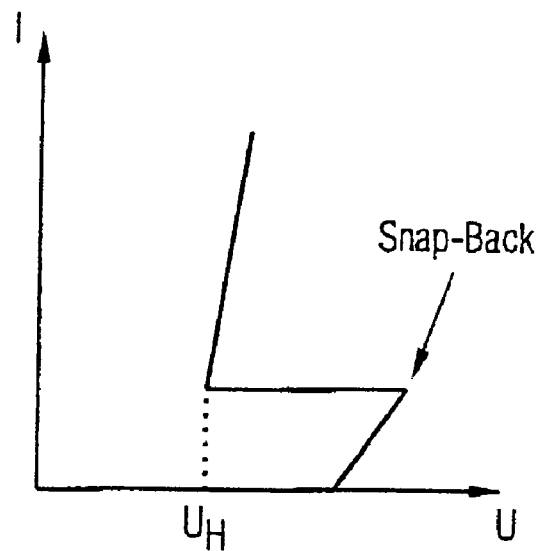
FIG. 1 is a graph of a current/voltage characteristic curve of a prior art ESD protection element configured as a bipolar transistor with a snapback behavior.

Unless specified otherwise, identical or functionally identical elements have been designated identically in all the figures of the drawing.

Figure 2:
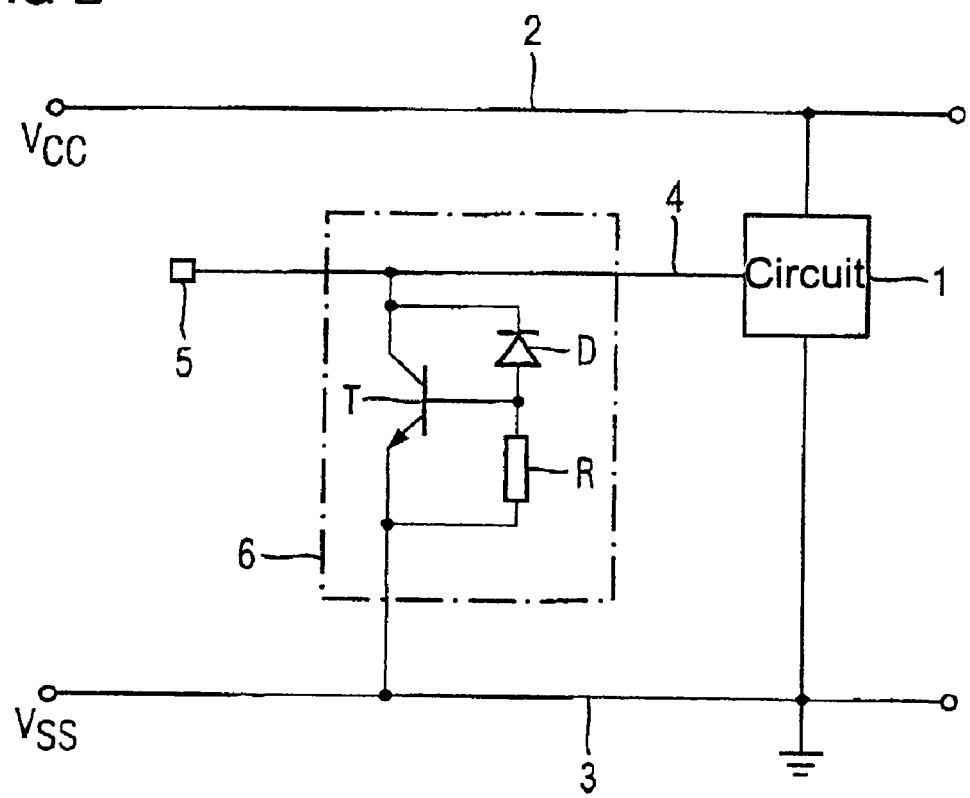
FIG. 2 is a block and schematic circuit diagram of an integrated circuit equipped with an ESD protection element according to the invention.

Referring now to the figures of the drawings in detail and first, particularly to FIG. 2 thereof, there is shown a circuit diagram of an integrated circuit equipped with an ESD protection element. In FIG. 2, an arbitrary integrated circuit 1 is connected to a first busbar 2 with a first supply potential VCC, for example, the supply voltage and also a second busbar 3 with a second supply potential VSS, for example, the reference ground. The integrated circuit 1 is connected to a terminal pad 5 (I/O port) through a connecting line 4. The terminal pad 5 may be configured as an input terminal for coupling input signals into and/or as an output terminal for coupling output signals out of the integrated circuit 1. An ESD protection element 6 configured as an npn protection transistor T is disposed between the terminal pad 5 and the integrated circuit 1.

In the present example, the ESD protection element 6 is connected between the connecting line 4 and the second busbar 3. It would also be conceivable, of course, to dispose the ESD protection element 6 between the connecting line 4 and the first busbar 2 or between the connecting line 4 and both busbars 2, 3.

A diode D is provided between the base-collector path of the protection transistor T, and a resistive element R, for example, an integrated resistor, is provided between the base-emitter path of the protection transistor T. In the present example, the base terminal of the protection transistor T is, thus, driven actively by the reverse-biased diode D.

The ESD protection element 6 protects the integrated circuit 1 from parasitic pulses coupled in through the terminal pad 5 in that these pulses are conducted away to one of the busbars 2, 3 through the ESD protection element 6 and, consequently, do not pass into the integrated circuit 1.

Figure 3:
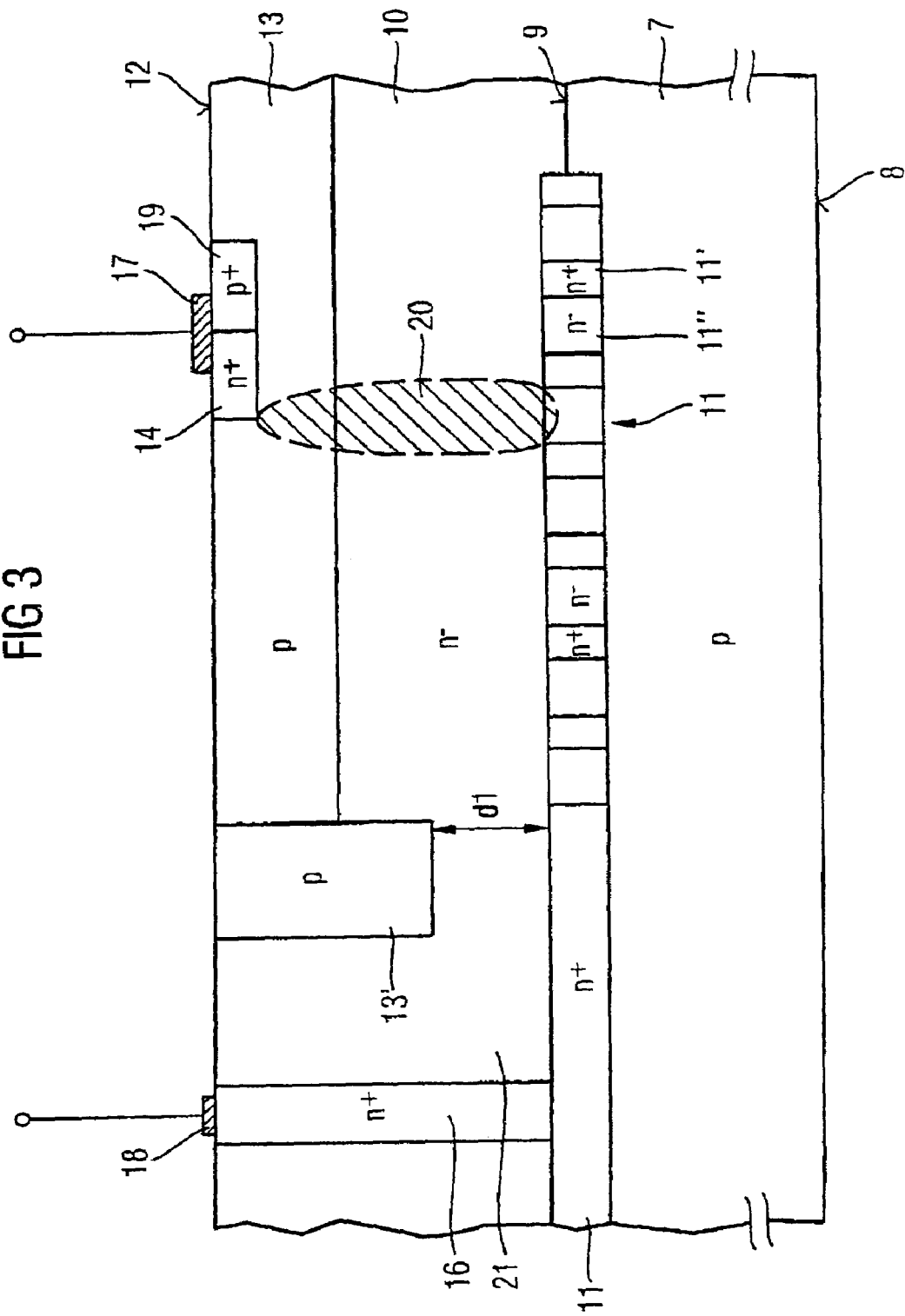
FIG. 3 is a fragmentary, diagrammatic cross-sectional view of an ESD protection structure according to the invention.

FIG. 3 shows a diagrammatic illustration of an ESD protection structure according to the invention. In FIG. 3, there is shown a p-doped semiconductor body 7, for example, a silicon wafer. The semiconductor body 7 has a wafer rear side 8 and a substrate front side 9. A weakly n-doped epitaxial layer 10 is applied on the side of the wafer surface 9. The doping concentration in the epitaxial layer 10 is defined by the process implementation for fabricating the integrated circuit 1. The epitaxial layer typically has a doping concentration of $10^{15}$ to $10^{18}$ cm$^{-3}$. The thickness of the epitaxial layer 10 varies between about 0.5 to 20 μm, depending on the technology employed.

A p-doped base zone 13 embedded in the epitaxial layer in well-type fashion is provided on the side of the wafer surface 12. A heavily n-doped emitter zone 14 is embedded, in turn, in the base zone 13. The base zone 13 has a typical doping concentration of $10^{16}$ to $10^{17}$ cm$^{-3}$, while the emitter zone 14 has a doping concentration of typically about $10^{19}$ cm$^{-3}$. Furthermore, a heavily p-doped contact zone 19 is embedded in the base zone 13, which is connected through a shunt to the emitter zone 14 and which serves for better contact-connection of the emitter zone 14. However, the regions 14, 19 could also be spaced apart from one another.

A multiplicity of buried regions 11 (buried layer) are additionally provided. In the present example, the buried regions 11' are n+-doped and disposed at the interface 9 between epitaxial layer 10 and semiconductor body 7. The buried regions are heavily n-doped regions 11' disposed at approximately the same depth in the semiconductor body 7. What is important in this case is that the heavily n-doped regions 11' are spaced apart from one another, resistance regions 11" being provided between adjacent regions 11'. The resistance regions 11" are, likewise, n-doped, but have a lower doping concentration than the regions 11'. The resistance regions 11" are, advantageously, but not necessarily, a constituent part of the epitaxial layer 10. This results in a buried layer 11 containing the regions 11' and resistance regions 11" and having alternately a high and a low doping concentration.

The holding voltage of the ESD protection structure can be set in a defined manner by the buried layer structured in this way and also the corresponding doping concentrations of the regions 11', 11".

The buried regions 11' may be produced by example by the introduction of a deposit on the surface 9 of the semiconductor body 7 before the growth of the epitaxial layer 10 and subsequent diffusion at a suitable temperature. However, it is also conceivable for the buried regions 11' to be produced after or during the growth of the epitaxial layer 10 by ion implantation. To obtain the desired vertical profile, a multiple implantation with suitably chosen images and doping doses is advantageous in this case. This should be followed by a thermal step for homogeneously distributing the doping atoms in the buried layer 11. The doping concentration in the buried layer 11 is often prescribed by the process implementation in the fabrication of the integrated circuit 1. To ensure the best possible conductivity, the buried regions 11' should be formed with the lowest possible impedance. On account of this, the buried regions 11' typically have a doping concentration of about $10^{19}$ to $10^2$ cm$^{-3}$.

With regard to the structure, the fabrication and the function of such a buried layer with laterally spaced-apart resistance regions, reference is made to the European Patent specification to Gossner mentioned in the introduction, the full contents of which are incorporated into the present patent application with regard to these subject matters.

The buried layer 11 is coupled to the wafer front side 12 of the semiconductor body 1 through a terminal zone 16. The terminal zone 16 is of the same conduction type as the buried layer 11 and has a highest possible doping concentration of typically about $10^{19}$ to $10^{20}$ cm$^{-3}$ to avoid undesirable resistances. In the present example, the terminal zone 16 extends from the wafer surface 12 right into the epitaxial layer 10. In such a case, the terminal zone 16 is formed as a trench and can be produced using known trench technology or, alternatively, also by deep implantation and/or diffusion.

Contact is made with the emitter zone 14 and the terminal zone 16 by customary contact-connections 17, 18 at the wafer surface 12. In FIG. 3, the emitter zone 14, the base zone 13, and the buried layer 11 respectively form the emitter, the base and the collector of the protection transistor T, which is, thus, configured as not actively driven in the example in FIG. 3.

According to the invention, the semiconductor component, furthermore, has a region with a reduced breakdown voltage. The region with a reduced breakdown voltage is formed by regions of the base zone 13' and of the buried layer 11, which have a smaller distance d1 from one another there in comparison with the remaining regions of the base zone 13 and of the buried layer 11. The region between the base zone regions 13' and the buried layer 11 defines an intermediate zone 21, which is a constituent part of the epitaxial layer 10 and, thus, also has the doping type and doping concentration thereof. The regions with a reduced breakdown voltage according to the invention, thus, have, on one hand, a smaller distance d1 in comparison with the remaining regions of the buried layer 11 and of the base zone 13, and, moreover, they are also spaced apart from the region of the buried layer 11 that is responsible for setting the holding voltage. To produce the reduced distance d1 between base zone 13 and buried layer 11, in the example in FIG. 3, the base zone 13 projects into the epitaxial layer 10 in plug-type or trench-type fashion. It would also be conceivable, of course, for the buried layer additionally or alternatively also to project into the intermediate layer 10 for the purpose of reducing the breakdown voltage.

Figure 4:
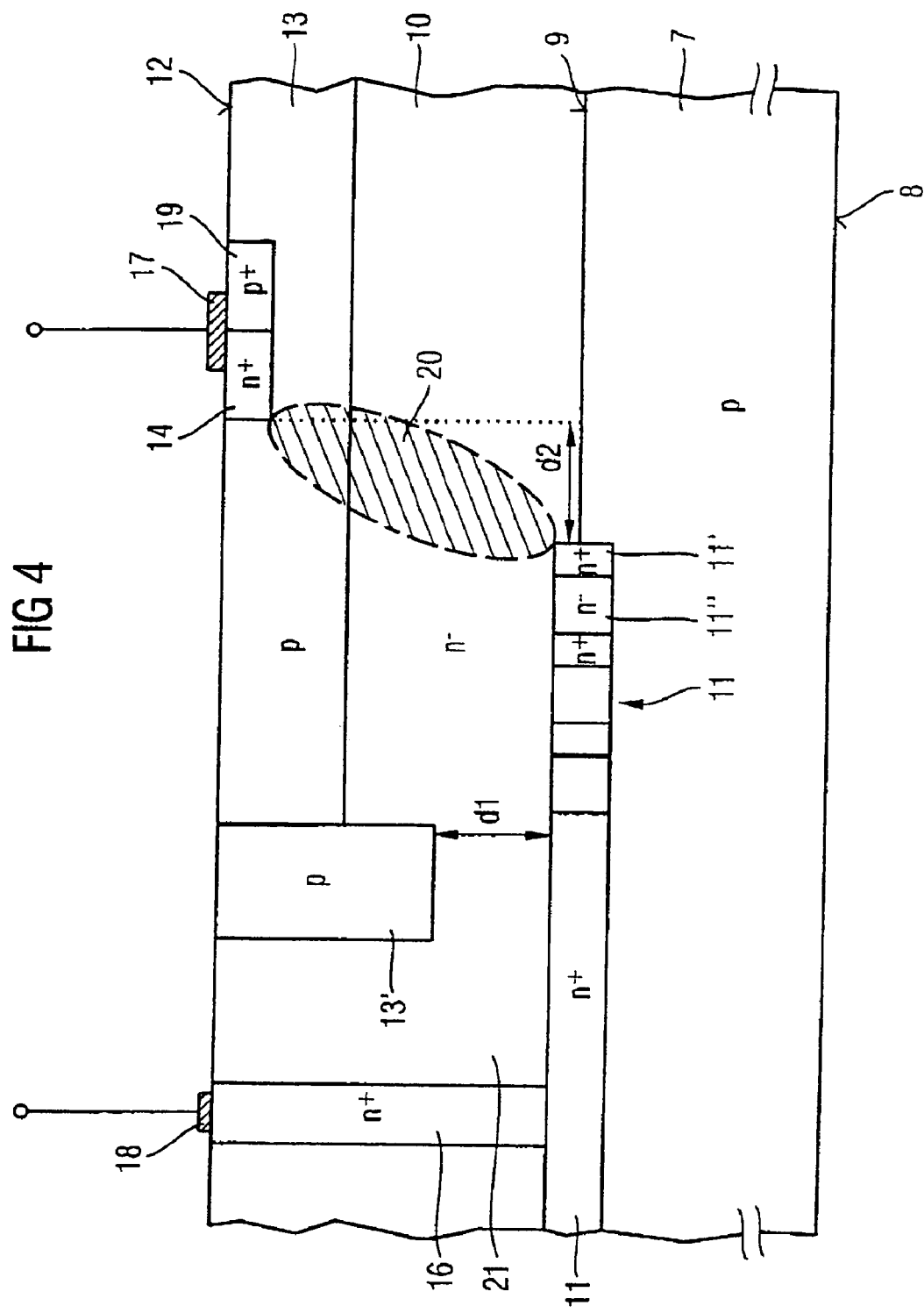
FIG. 4 is a fragmentary, diagrammatic cross-sectional view of a further, preferred refinement of the ESD protection structure according to the invention.

FIG. 4 shows a diagrammatic illustration of a preferred development of the ESD protection structure according to the invention as illustrated in FIG. 2.

In contrast to the ESD structure illustrated in FIG. 3, the buried layer 11 is, in this case, formed in a manner laterally offset with respect to the emitter zones 14 in the projection of the surface. Because, during the fabrication of the buried layer 11 functioning as a collector, the outdiffusion is effected three-dimensionally after an implantation, this results in a further increase in the holding voltage, in that, the plasma 20 formed between collector and emitter adjoins respective edges (2-D effect) or respective corners (3-D effect) of the buried regions 11'. At these edges or corners, the diffusion profile is very much flatter than in the case where the plasma 20 impinges areally on the buried regions 11', as in the case, for example, in FIG. 3.

With regard to the structure, the fabrication and the function of emitter zones 14 and collector zones 11, 11' disposed offset with respect to the another in this way, reference is made to Gossner et al. cited in the introduction, the entire content of which are incorporated into the present patent application with regard to these subject matters.

Figure 5:
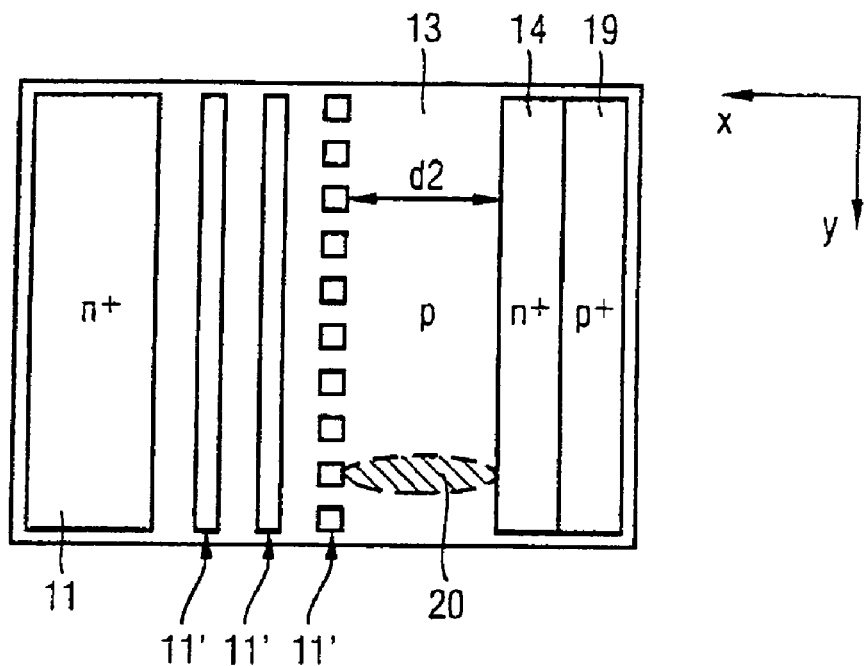
FIG. 5 is a fragmentary, diagrammatic plan view of a layout of the ESD protection structure according to the invention.

FIG. 5 shows the layout of an ESD protection structure according to the invention corresponding to FIG. 4 in a diagrammatic plan view. FIG. 5 reveals that the highly doped collector regions 11' are disposed laterally offset with respect to the emitter zone 14 in the plan view corresponding to FIG. 4, which distance defines a coordinate direction X. The first row of highly doped collector regions 11', which are at the smallest distance from the emitter zones 14, are, furthermore, subdivided into square individual regions which are additionally disposed such that they are spaced apart and offset from one another in the lateral direction, i.e., a Y coordinate direction.

For setting the holding voltage, the plasma 20 formed between the buried collector regions 11' and the emitter zone 14, thus, adjoins the respective edges of the buried collector regions 11' so that a two-dimensional effect results in this case.

Figure 6:
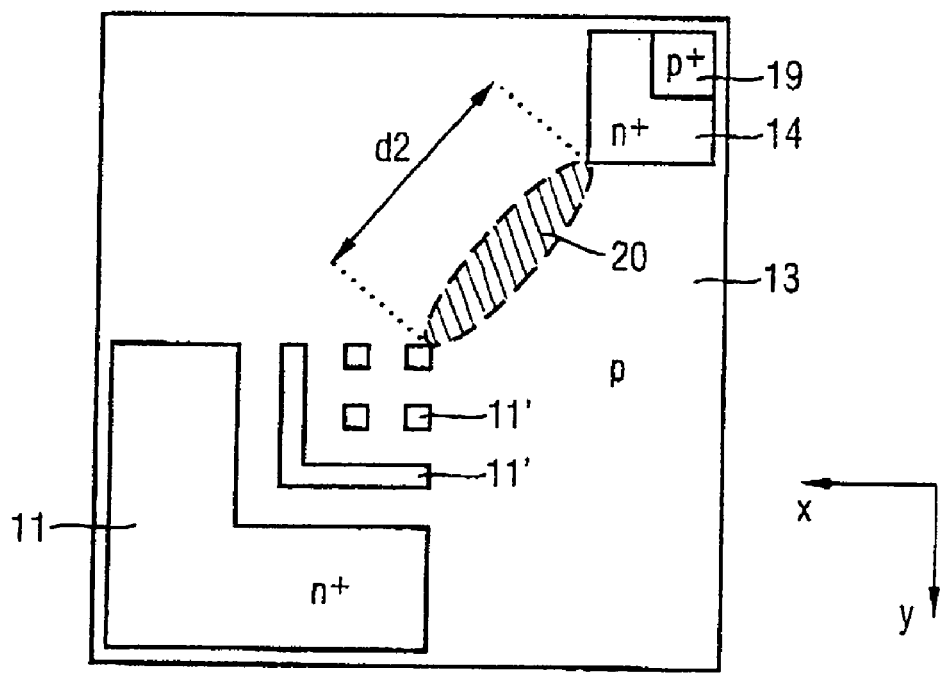
FIG. 6 is a fragmentary, diagrammatic plan view of a layout of a further, preferred refinement of the ESD protection structure according to the invention.

FIG. 6 shows a further, particularly advantageous exemplary embodiment for setting the holding voltage, in which, in contrast to the exemplary embodiment in FIG. 5, a three-dimensional effect is additionally obtained in the setting of the holding voltage. In such a case, the collector regions 11' are laterally offset from the emitter zones 14 not only in the X coordinate direction but also in the Y coordinate direction so that, during the formation of a plasma 20, the plasma 20 is formed from the emitter zones 14 up to a corner of the collector regions 11'. An approximately three-dimensional effect is obtained in this way.

Consequently, what is crucial to the ESD structures illustrated in FIGS. 5 and 6 is that the buried collector regions 11' and the corresponding emitter zones 14 are disposed such that the outer edges of the emitter zones 14 are disposed laterally offset with respect to the outer edge or the corners of the buried collector regions 11'. The lateral offset is characterized by a distance d2. The distance d2 and, furthermore, the thickness of the epitaxial layer are, thus, a measure of the holding voltage.

The lateral offset of the buried collector regions 11' from the emitter regions 14, thus, results in a quasi-vertical ESD protection structure. In contrast to purely vertical ESD protection structures, in which the holding voltage substantially results from the vertical distance between the buried collector regions 11' and the emitter zone 14, in the case of the quasi-vertical ESD protection structures, the lateral offset of the collector zone 11 relative to the emitter zone 14 enables this distance to be increased further and, thus, the holding voltage to be correspondingly increased.

The idea underlying the present invention is based substantially on construction measures for the defined and independent setting of the holding voltage and breakdown voltage. To illustrate this idea underlying the present invention, an explanation will be given in the following text of the physical background for an ESD protection structure with snapback behavior.

The current/voltage profile shown in FIG. 1 through to the snapback point for a bipolar ESD protection structure results from the avalanche breakdown between p-doped base zone 13 and n-doped epitaxial layer 10. The hole current flowing to the p+-doped contact zone 19 biases the p-doped base zone 13 relative to the n+-doped emitter zone 14, which results in a parasitic npn bipolar transistor with injection of electrons from the emitter zone 14 into the base zone 13. The electrons flow to the blocked pn junction. Because additional electrons are, then, present for the avalanche multiplication, the hole current can be maintained with a lower field, i.e., with smaller voltages. This leads to the jump back to the holding voltage. The maximum electric field migrates from the pn junction between epitaxial layer 10 and base zone 13 to the interface between epitaxial layer 10 and buried layer 11 (the so-called Kirk effect). Consequently, between the buried layer 11 and the emitter zone 14, the p- and n-doped regions of the epitaxial layer 10 and base zone 13 are flooded by charge carriers. A plasma 20 is formed here, which was indicated diagrammatically in FIGS. 3 to 6.

The holding voltage of the ESD protection structure is determined by the charge carrier ratios in the boundary region between plasma 20 and buried layer 11, to be precise in the direct region of the transition between the plasma and the buried layer 11. The flatter the collector profile is made, the larger the holding voltage becomes.

The profile of the collector, i.e., the doping concentration of the buried layer, is defined by the dictates of the process and, thus, cannot be varied. According to the invention, however, the collector is not implanted over the whole area, but, rather, is provided with openings that may be realized, for instance, in the form of plugs and/or strips. In addition to the setting of the holding voltage by the collector profile, the holding voltage can also be influenced by the voltage drop across the plasma 20. The larger the distance d2 (FIG. 4) between outer edge of emitter and collector becomes, the larger the voltage drop across the plasma and, thus, the holding voltage become.

The collector so structured, thus, enables the holding voltage to be set in a defined manner depending on the application and independently of process stipulations to the greatest possible extent. Independently thereof, the breakdown voltage can be set in a defined manner by a blocking pn junction that is disposed spatially from the collector regions 11', which serve to set the holding voltage. There, the p-doped base zone 13 projects deeper into the epitaxial layer 10 than in the remaining regions of the base zone 13. These regions 13' of the base zone 13 are spaced apart from the buried layer 11 by an n-doped intermediate layer 21. The breakdown voltage of the ESD protection structure can, thus, be set in a defined manner by the doping concentration of the base zone regions 13', of the intermediate zone 21, and of the buried layer 11 and also by the thickness d1 of the intermediate layer 21. The ESD protection element will, thus, preferably break down first precisely in the structure prescribed by the region 13' and the intermediate region 21. The region between emitter zone 14 and collector regions 11' is, thus, unimportant for the dimensioning of the breakdown voltage of the ESD protection element.

Although the present invention has been described above based upon preferred exemplary embodiments, it is not restricted thereto, but, rather, can be modified in diverse ways.

In particular, a multiplicity of different ESD protection structures can be provided in a very simple manner by interchanging the conductivity types n for p, and visa-versa, and by varying the doping concentrations.

Moreover, the ESD protection element was configured as an npn transistor in the above examples. However, it would also be conceivable to use a pnp transistor as the protection transistor. The configuration depends only on the underlying technology for fabricating the integrated circuit. It would also be conceivable, of course, alternatively to realize the protection transistor as a thyristor, as an IGBT, or as a customary semiconductor component that can be controlled in a different way and is connected up in a suitable manner.

In the example in FIG. 2, the base terminal of the npn transistor is actively driven by a diode, but this active driving of the base of the protection transistor T could also be dispensed with.

In the projected plan view in FIGS. 5 and 6, the buried collector regions are formed in the strip-type, rectangular, or square fashion. However, triangular, polygonal, round, or oval structures or structures of whatever configuration, would also conceivable for the formation of the buried collector regions. It would be particularly advantageous for the collector regions to be disposed annularly or at least partly annularly around the emitter zone.

The base zone and emitter zone are formed in well-type fashion in the present example. However, v-shaped, u-shaped, trench-type, or similar structures would also be conceivable therefor.

In the exemplary embodiments above, it was explained that the integrated circuit and also the associated ESD protection element are, preferably, realized in bipolar fashion or embodied using smart power technology. It goes without saying that the integrated circuit and also the ESD protection circuit may also be formed using another technology, e.g., a CMOS technology.

It would also be advantageous for an anode zone to be disposed between the buried layer and the terminal pad. In this case, the ESD protection element is configured as an IGBT or as a thyristor.

The invention is particularly advantageous when the ESD protection element is used in a microcontroller, in a semiconductor memory, in a logic circuit, or in an integrated circuit configured as a smart power circuit.

To summarize, it may be established that the structure described provides very elegantly a spatial separation for the setting of the breakdown voltage and holding voltage in the case of an ESD protection element of bipolar construction.

This application claims the priority, under 35 U.S.C. § 119, of German patent application No. 103 19 539.4, filed Apr. 30, 2003; the entire disclosure of the prior application is herewith incorporated by reference.

I claim:

1. An ESD protection structure for protecting an integrated circuit from electrostatic discharge, comprising:
    a bipolar protection element having:
        an emitter zone of a first conduction type forming an emitter;
        a buried layer of said first conduction type forming a collector;
        a base zone of a second conduction type disposed between said emitter zone and said buried layer and forming a base;
        an intermediate layer disposed between said base zone and said buried layer and spacing said base zone apart from said buried layer;
        said buried layer having at least one section in which are disposed highly doped and lightly doped regions, said highly doped regions being spaced apart from one another by said lightly doped regions; and
        a breakdown region having a reduced breakdown voltage of said protection element, said breakdown region being disposed in a part of said protection element spaced apart from said section of said buried layer.

2. The ESD protection structure according to claim 1, wherein:
    partial regions of said base zone and of said buried layer form said breakdown region; and
    said partial regions of said base zone and of said buried layer have a smaller distance from one another in comparison with remaining regions of said base zone and of said buried layer.

3. The ESD protection structure according to claim 2, wherein at least one of said base zone and said buried layer in said breakdown region projects into said intermediate layer in one of a plug and a trench.

4. The ESD protection structure according to claim 2, wherein a portion of said at least one of said base zone and said buried layer in said breakdown region is one of a plug and a trench projecting into said intermediate layer.

5. The ESD protection structure according to claim 1, wherein at least one of said buried layer and said breakdown region are disposed at least partially in an annular shape around said emitter zone.

6. The ESD protection structure according to claim 1, wherein at least one of said buried layer and said breakdown region are disposed at least partially around said emitter zone.

7. The ESD protection structure according to claim 1, wherein at least one of said buried layer and said breakdown region has a cross-sectional shape selected from at least one of the group consisting of a strip shape, a rectangular shape, a round shape, and an annular shape.

8. The ESD protection structure according to claim 1, wherein said emitter zone and said buried layer are disposed laterally offset with respect to one another.

9. The ESD protection structure according to claim 1, wherein, when at least one of said emitter zones and said buried layer is at least partly angular, said buried layer is offset laterally both:
    in a first direction, prescribed by an edge of at least one of said emitter zone and said buried layer; and
    in a second direction perpendicular thereto.

10. The ESD protection structure according to claim 1, wherein said intermediate layer is of said first conduction type and said intermediate layer is a constituent part of an epitaxial layer.

11. The ESD protection structure according to claim 1, further comprising at least one highly doped terminal zone of said first conduction type, said terminal zone being connected to said buried layer and is to be connected to a busbar for conducting away an electrical pulse.

12. The ESD protection structure according to claim 1, further comprising
    a terminal pad; and
    an anode zone of said second conduction type disposed between said buried layer and said terminal pad.

13. The ESD protection structure according to claim 1, further comprising:
    a terminal pad to be protected;
    at least one busbar with a supply potential; and
    said bipolar protection element having controlled load path disposed between said terminal pad and said busbar for conducting away a coupled-in electrical pulse.

14. The ESD protection structure according to claim 1, wherein:
    the integrated circuit has a terminal pad to be protected and at least one busbar with a supply potential; and
    said bipolar protection element has a controlled load path to be disposed between the terminal pad and the busbar for conducting away a coupled-in electrical pulse.

15. The ESD protection structure according to claim 1, wherein:
    the integrated circuit has at least one busbar with a supply potential; and
    said bipolar protection element has:
        a terminal pad to be protected; and
        a controlled load path disposed between said terminal pad and the busbar for conducting away a coupled-in electrical pulse.

16. The ESD protection structure according to claim 1, further comprising at least one drive device connected to said base and actively driving said base.

17. The ESD protection structure according to claim 1, wherein said drive device is at least one of an integrated diode and an integrated resistor.

18. The ESD protection structure according to claim 1, further comprising at least one means for actively driving said base.

19. The ESD protection structure according to claim 1, wherein said drive means is at least one of an integrated diode and an integrated resistor.

20. A semiconductor body, comprising:
    an integrated circuit;
    at least one terminal pad;
    an electrical connecting line electrically connecting said terminal pad to said integrated circuit;
    busbars, at least one of said busbars being connected to said integrated circuit and, at least during operation of said busbar, supplying at least one supply potential to said integrated circuit; and
    at least one ESD protection structure for protecting said integrated circuit from electrostatic discharge, said protection structure having a bipolar protection element according to claim 1, said bipolar protection element being disposed between said terminal pad and said integrated circuit and being connected to at least one of said busbars.

21. The semiconductor body according to claim 20, wherein said integrated circuit is at least one of the group consisting of a semiconductor memory, a logic circuit, a smart power semiconductor component, and a program-controlled unit.

22. An ESD protection structure, comprising:
a bipolar protection element to be connected to an integrated circuit for protecting the integrated circuit from electrostatic discharge, said bipolar protection element having:
an emitter zone of a first conduction type;
a buried layer of said first conduction type;
a base zone of a second conduction type disposed between said emitter zone and said buried layer;
an intermediate layer spacing said base zone apart from said buried layer;
said buried layer having at least one section in which are disposed highly doped and lightly doped regions, said highly doped regions being spaced apart from one another by said lightly doped regions; and
a breakdown region having a reduced breakdown voltage and being disposed in a part of said protection element spaced apart from said section of said buried layer.

23. A semiconductor body, comprising:
an integrated circuit;
at least one terminal pad;
an electrical connecting line electrically connecting said terminal pad to said integrated circuit;
busbars, at least one of said busbars being connected to said integrated circuit and, at least during operation of said busbar, supplying at least one supply potential to said integrated circuit; and
at least one ESD protection structure for protecting said integrated circuit from electrostatic discharge, said protection structure having a bipolar protection element according to claim 20, said bipolar protection element being disposed between said terminal pad and said integrated circuit and being connected to at least one of said busbars.

24. The semiconductor body according to claim 23, wherein said integrated circuit is at least one of the group consisting of a semiconductor memory, a logic circuit, a smart power semiconductor component, and a program-controlled unit.

25. A semiconductor body, comprising:
an integrated circuit;
at least one terminal pad;
an electrical connecting line electrically connecting said terminal pad to said integrated circuit;
busbars, at least one of said busbars being connected to said integrated circuit and, at least during operation of said busbar, supplying at least one supply potential to said integrated circuit;
at least one ESD protection structure for protecting said integrated circuit from electrostatic discharge, said protection structure having a bipolar protection element disposed between said terminal pad and said integrated circuit and being connected to at least one of said busbars, said bipolar protection element having:
an emitter zone of a first conduction type;
a buried layer of said first conduction type;
a base zone of a second conduction type disposed between said emitter zone and said buried layer;
an intermediate layer spacing said base zone apart from said buried layer;
said buried layer having at least one section in which are disposed highly doped and lightly doped regions, said highly doped regions being spaced apart from one another by said lightly doped regions; and
a breakdown region having a reduced breakdown voltage and being disposed in a part of said protection element spaced apart from said section of said buried layer; and
at least one of said base zone and said buried layer being electrically connected to said connecting line.

26. The semiconductor body according to claim 25, wherein said integrated circuit is at least one of the group consisting of a semiconductor memory, a logic circuit, a smart power semiconductor component, and a program-controlled unit.

* * * * *